United States Patent
Heid et al.

(10) Patent No.: US 7,109,715 B2
(45) Date of Patent: Sep. 19, 2006

(54) GENERATOR OF TIME-VARIABLE MAGNETIC FIELDS OF A MAGNETIC RESONANCE DEVICE AND MAGNETIC RESONANCE DEVICE

(75) Inventors: Oliver Heid, Gunzenhausen (DE);
Jürgen Nistler, Erlangen (DE);
Markus Vester, Nümberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/984,636

(22) Filed: Nov. 9, 2004

(65) Prior Publication Data
US 2005/0099183 A1   May 12, 2005

(30) Foreign Application Priority Data
Nov. 10, 2003  (DE) ............................... 103 52 381

(51) Int. Cl.
*G01V 3/00* (2006.01)
(52) U.S. Cl. ......................... 324/322; 324/318
(58) Field of Classification Search ............... 324/318, 324/319, 322, 309, 307, 310, 328, 314, 300; 600/410
See application file for complete search history.

(56) References Cited

U.S. PATENT DOCUMENTS

| 4,680,548 A | 7/1987 | Edelstein et al. |
| 4,864,241 A | 9/1989 | Goldie |
| 6,501,977 B1 * | 12/2002 | Kimmlingen ................ 600/410 |
| 6,930,482 B1 * | 8/2005 | Heid et al. ................... 324/318 |
| 2002/0105329 A1 * | 8/2002 | Heid et al. ................... 324/318 |
| 2003/0107376 A1 | 6/2003 | Yasuhara |
| 2005/0073312 A1 | 4/2005 | Heid |

FOREIGN PATENT DOCUMENTS

| DE | 34 45 724 A1 | 6/1985 |
| DE | 42 32 884 A1 | 3/1994 |
| DE | 44 14 371 A1 | 7/1995 |
| GB | 2 401 946 A | 11/2004 |

* cited by examiner

Primary Examiner—Brij B. Shrivastav

(57) ABSTRACT

A generator of time-variable magnetic fields of a magnetic resonance device having an examination space for registering at least one area to be examined of an item being examined has the following features:
  the conductors of a gradient coil arrangement of the generator define an area at least partially surrounding the examination space,
  said area contains at least a partial area which is free from conductors of the gradient coil arrangement and which contains conductors of a radio frequency antenna of the generator, and
  a field flowback space, inter alia for fields of the radio frequency antenna, extends proceeding from the partial area away from the examination space and is delimited beyond said partial area by a radio frequency shield.

22 Claims, 4 Drawing Sheets

GENERATOR OF TIME-VARIABLE MAGNETIC FIELDS OF A MAGNETIC RESONANCE DEVICE AND MAGNETIC RESONANCE DEVICE

CROSS REFERENCE TO RELATED APPLICATIONS

This application claims priority to the German application No. 10352381.2, filed Nov. 10, 2003 and which is incorporated by reference herein in its entirety.

FIELD OF INVENTION

The invention relates to a generator of time-variable magnetic fields of a magnetic resonance device and to a magnetic resonance device having said generator.

BACKGROUND OF INVENTION

Magnetic resonance is a known technology for, inter alia, obtaining images of the interior of an item being examined. In a magnetic resonance device a static basic magnetic field generated by a basic field magnet is overlaid with gradient fields switched at high speed and generated by a gradient coil system. The magnetic resonance device further includes a radio frequency (RF) antenna which radiates radio frequency signals into the item being examined in order to trigger magnetic resonance signals, and registers the triggered magnetic resonance signals on the basis of which magnetic resonance images are produced.

A magnetic resonance device is known from DE 44 14 371 A1 in which a radio frequency shield is located between a radio frequency antenna and a gradient coil system of the magnetic resonance device and is embodied in such a way as to be permeable in the low-frequency range for the electromagnetic fields generated by the gradient coil system and impermeable in the radio frequency range for the fields generated by the radio frequency antenna. The radio frequency shield contains a first electrically conducting layer arrangement and a second such arrangement located opposite the first, mutually separated by a dielectric, with said layer arrangements containing strip conductors arranged side-by-side and mutually separated by electrically insulating slots, with the slots in the first layer arrangement being displaced relative to those in the second arrangement, and with adjacent strip conductors being interconnected in at least one layer arrangement via specifically arranged jumpers which conduct radio frequency currents and which contain, for example, capacitors.

Possible embodiments of a radio frequency shield are known from, for instance, DE 34 45 724 A1, wherein, for example, shielding layers are arranged on both sides of the gradient coil system of the magnetic resonance device.

The radio frequency antenna of the magnetic resonance device is embodied in the form of, for example, what is termed a birdcage antenna. A birdcage antenna for generating a homogeneous radio frequency field within a volume enclosed thereby is generally embodied in such a way that conductors are arranged mutually parallel and equidistantly spaced on a cylinder jacket and are interconnected by means of end rings. Tuning to the high-pass and low-pass filter ranges is therein effected by introducing capacitances in each of the conductors or the end rings between the conductors so that a homogeneous radio frequency field results in the event of resonance. Embodiments of a birdcage antenna of said type can be found in, for example, U.S. Pat. No. 4,680,548.

SUMMARY OF INVENTION

It is further known from DE 42 32 884 A1 how, in a magnetic resonance device having a basic field magnet of pole-flange type, to locate a radio frequency shield, embodiable with capacitively bridged slots, between the gradient coil system mounted on the pole flanges and embodied in substantially planar form and the antenna system. It is further known from DE 42 32 884 A1 that the endeavor in the case of basic field magnets of pole-flange type is to minimize the pole-flange spacing so as to keep the weight of the basic field magnet low and achieve better basic magnetic field homogeneity. All the elements installed between the pole flanges, such as the gradient coil system, radio frequency shield, and antenna system, must therefore also be kept as flat as possible. On the other hand it is advantageous for the antenna system to be located as far away as possible from the radio frequency shield so that the antenna system can operate with a high degree of efficiency, especially when used as a receive antenna for magnetic resonance signals.

An MR device is known from U.S. Pat. No. 4,864,241 A in which eddy currents are compensated. This is done with the aid of gradient coils that are divided in two and usually form a hollow-cylindrical unit. A likewise hollow-cylindrical RF antenna having a smaller radius is introduced into the gradient coil unit for generating RF fields. Disadvantages of a structural design of this type are that it requires a large amount of space and that an examination volume of the MR device is determined by the diameter of the RF antenna.

An object of the invention is to provide a generator of time-variable magnetic fields of a magnetic resonance device and a magnetic resonance device having the generator so that the generator is as compact as possible while at the same time exhibiting a high degree of efficiency.

Said object is achieved by the claims. Advantageous embodiments are described in the dependent claims.

According to an embodiment of the invention, a generator of time-variable magnetic fields of a magnetic resonance device having an examination space for registering at least one area to be examined of an item being examined exhibits the following features:

the conductors of a gradient coil arrangement of the generator define an area at least partially surrounding the examination space, said area contains at least a partial area which is free from conductors of the gradient coil arrangement and which contains conductors of a radio frequency antenna of the generator, and a field flowback space, inter alia for fields of the radio frequency antenna, extends proceeding from the partial area away from the examination space and is delimited beyond said partial area by a radio frequency shield.

Conventional solutions already have to provide sufficient space between the gradient coils of a non-actively shielded gradient coil system and the basic field magnet or, as the case may be, between the gradient coils and the associated shield coils of an actively shielded gradient coil system for closing field lines of the gradient fields that can be generated by means of the gradient coils. Said space not previously available for a flowback of a radio frequency field capable of being registered by means of the radio frequency antenna is utilized according to the invention and is hence doubly used, as it were, so that the combination of gradient coil system and radio frequency antenna is embodiable having less overall height compared to like conventional solutions and with a comparable degree of efficiency. In a first instance this enables the basic field magnet of a magnetic resonance device to be dimensioned smaller without altering the space in said magnetic resonance device provided for accommodating a patient, and thus to be substantially more economical. In a second instance, more space is achieved for accommodating a patient without altering the basic field magnet, said increased space inter alia enhancing patient comfort.

BRIEF DESCRIPTION OF THE DRAWINGS

Further advantages, features, and specifics of the invention will emerge from the exemplary embodiments of the invention described below with the aid of the Figures.

DETAILED DESCRIPTION OF INVENTION

Figure 1:
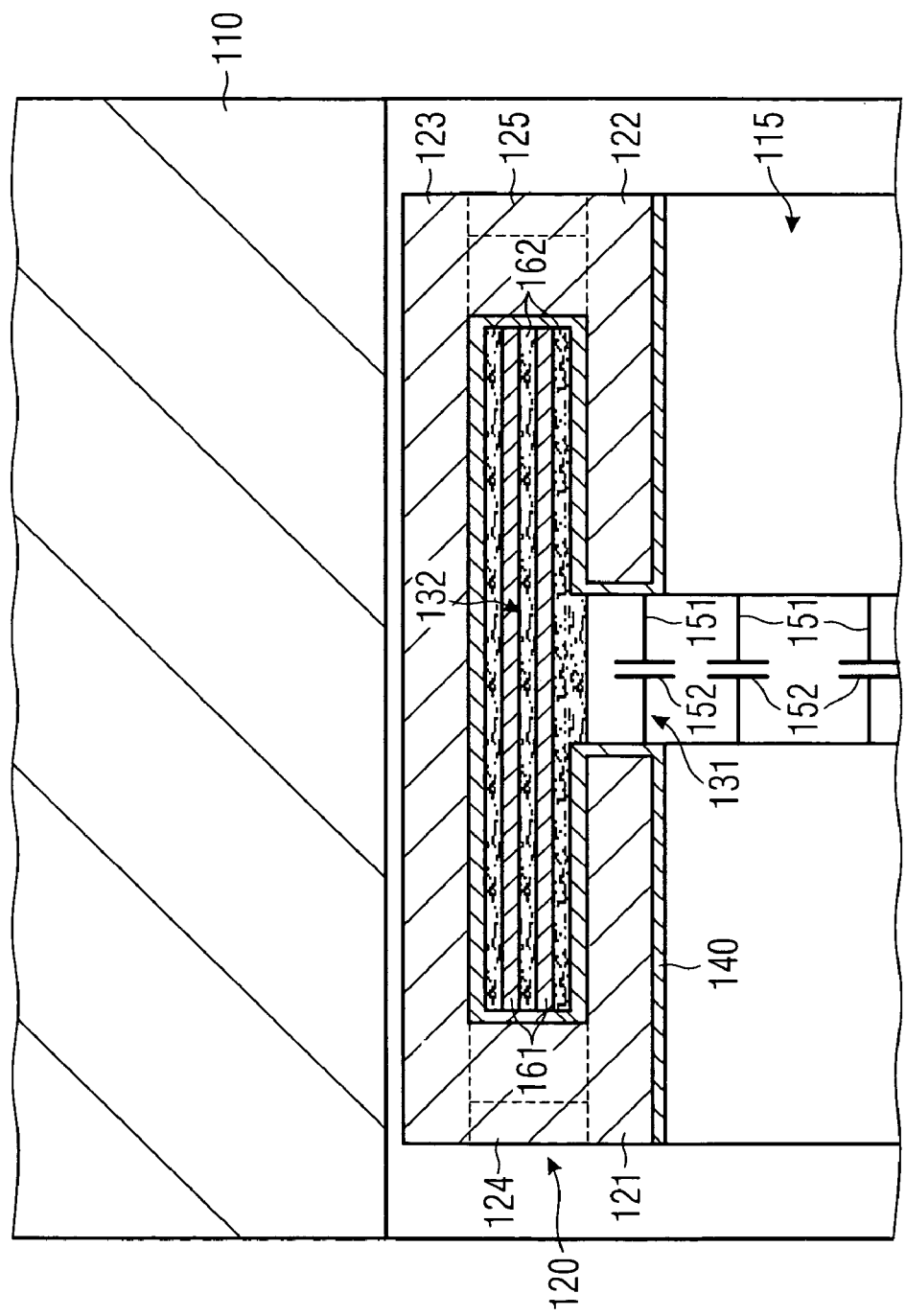
FIG. 1 shows a longitudinal section through a top half of a magnetic resonance device having a tunnel-like space for accommodating a patient and having a generator of time-variable magnetic fields, which generator contains a field flowback space having a bracing element.

As an exemplary embodiment of the invention, FIG. 1 shows a longitudinal section through a top half of a magnetic resonance device having a tunnel-like space 115 for accommodating a patient. Said magnetic resonance device contains a substantially hollow-cylindrical superconducting basic field magnet 110 for generating an as homogeneous as possible static basic magnetic field in said space 115 for accommodating a patient. Located in the cavity of said basic field magnet 110 is a generator 120 of time-variable magnetic fields which contains an actively shielded gradient coil system and a radio frequency antenna.

The generator 120 contains two hollow-cylindrical areas 121 and 122 in which are located electrical conductors of a first and second transversal gradient coil and of a longitudinal gradient coil for generating gradient fields that can be switched at high speed. Extending between the areas 121 and 122 is a hollow-cylindrical free space 131 functioning as an opening for a hollow-cylindrical field flowback space 132 located behind it and forming an undercut in terms of said hollow-cylindrical free space 131. An area of the generator 120 facing the space 115 for accommodating a patient, including the areas bordering the free space 131 and field flowback space 132, is furthermore provided with a radio frequency shield 140. Said radio frequency shield 140 contains, in a known manner, for example a plurality of layers of an electrically conducting foil and is embodied with capacitively bridged slots.

The hollow-cylindrical free space 131 is bridged with conductor rods 151 for forming the radio frequency antenna. Said conductor rods 151 are conductively connected on a radio frequency basis to the radio frequency shield 140. A part of the radio frequency shield 140 also forms a part of the current paths of the radio frequency antenna. The conductor rods 151 are interrupted approximately in the middle for intermediately connected resonance capacitors 152 for embodying a low-pass birdcage radio frequency antenna.

Field lines of a radio frequency field that can be generated by means of the radio frequency antenna or, as the case may be, registered by means of the radio frequency antenna can herein close across the hollow-cylindrical free space 131 within the field flowback space 132. Double use, as it were, is here made of the field flowback space 132 in that it allows both the field lines of the radio frequency field and the field lines of the gradient fields generated by the gradient coils to close within it. The radio frequency antenna's efficiency is greater the more longitudinally extended the field flowback space 132 is embodied. The longitudinal extension of said field flowback space 132 is limited solely by the need to prevent integral multiples of a λ/2 resonance in the longitudinal direction.

The generator 120 furthermore contains a hollow-cylindrical area 123 in which are located conductors of the shield coils belonging to the gradient coils. The remaining area of the generator 120 is available for, inter alia, accommodating parts of a shimming system and/or of a cooling system of the generator 120. In particular two hollow-cylindrical areas 124 and 125 of the remaining area are used for connecting the gradient coils to the associated shield coils.

A bracing element is located within of the field flowback space 132 for reducing mechanical vibrations and oscillations, and hence noise, occurring while the magnetic resonance device is in operation. Said bracing element is embodied in such a way that, owing to its dielectric properties, it impacts minimally on the functioning of the radio frequency antenna, with the properties of air being ideal for this. The bracing element consists of a combination of a small constituent of fiber-glass reinforced plates 161 serving to provide bracing and a larger constituent of a foam material 162 characterized by low dielectric radio frequency loss, for example Rohacell. Favored by the occurrence in the field flowback space 132 of essentially only radially directed forces, the generator 120 is adequately braced by the plates 161 occupying approximately 15–20% of the volume of the field flowback space 132. Dielectric loss is kept low owing to the remaining volume's being filled with the low-loss foam material 162.

Figure 2:
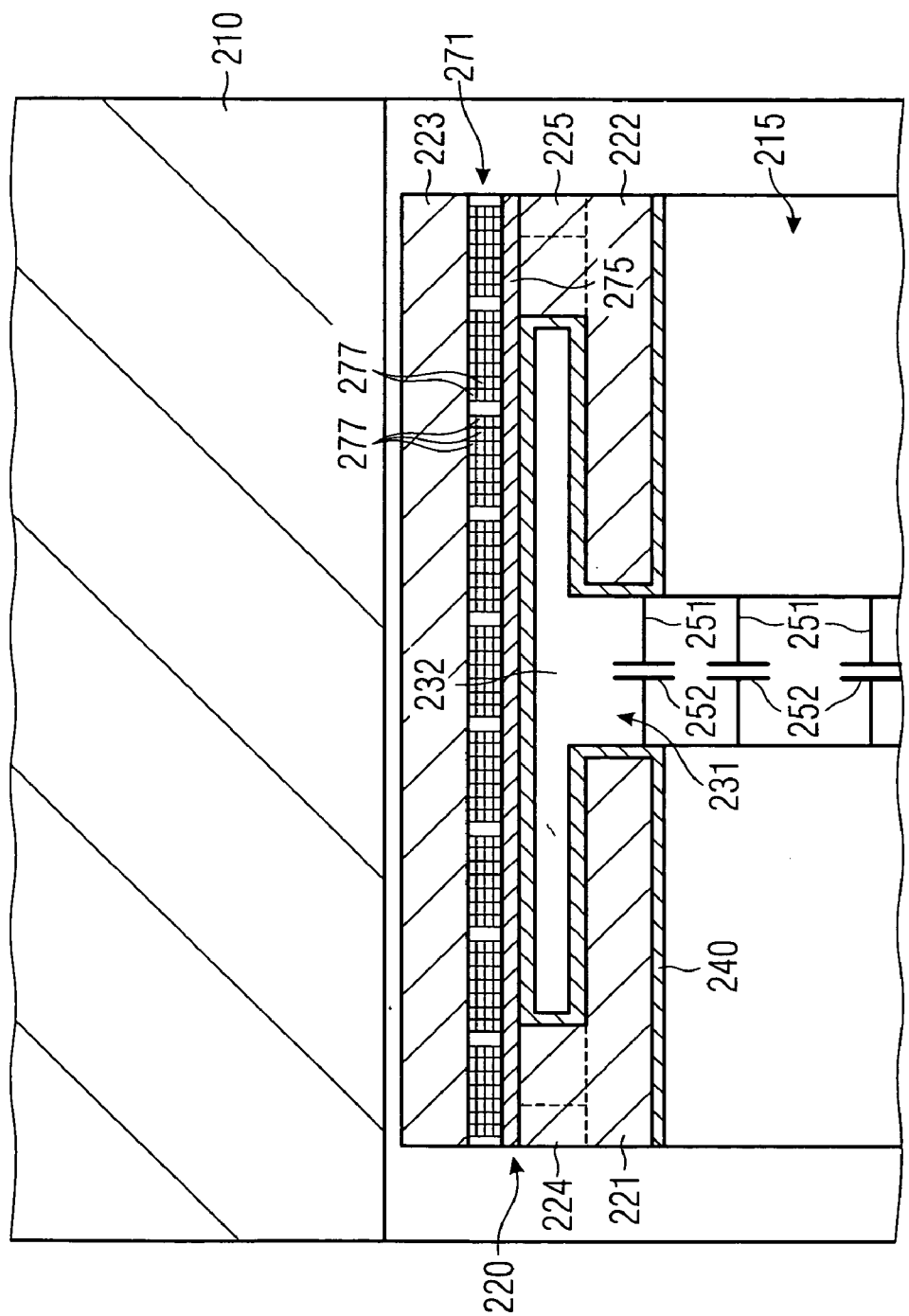
FIG. 2 shows a longitudinal section through a top half of a magnetic resonance device having a tunnel-like space for accommodating a patient and having a generator of time-variable magnetic fields, which generator contains a field flowback space and a shimming device located outside said field flowback space.

As a further exemplary embodiment of the invention, FIG. 2 shows a longitudinal section through a top half of a magnetic resonance device having a tunnel-like space 215 for accommodating a patient. The magnetic resonance device includes a superconducting basic field magnet 210 approximately hollow-cylindrical in shape for generating an as homogeneous as possible static basic magnetic field in the space 215 for accommodating a patient. A generator 220 of time-variable magnetic fields comprising an actively shielded gradient coil system and a radio frequency antenna is located in the cylinder-like cavity of the basic field magnet 210.

The generator 220 includes two hollow-cylindrical areas 221 and 222 in which are located electrical conductors of gradient coils of the gradient coil system. Extending between the areas 221 and 222 is a hollow-cylindrical free space 231 functioning as an opening for a hollow-cylindrical field flowback space 232 located behind it and forming an undercut in terms of said hollow-cylindrical free space 231. The generator 220 furthermore includes a radio frequency shield 240. The hollow-cylindrical free space 231 is bridged with conductor rods 251 for forming the radio frequency antenna. Said conductor rods 251 are conductively connected on a radio frequency basis to the radio frequency shield 240. The conductor rods 251 are interrupted approximately in the middle for intermediately connected resonance capacitors 252.

The generator 220 furthermore contains a hollow-cylindrical area 223 in which are located conductors of the shield coils belonging to the gradient coils. The remaining area of the generator 220 is available for, inter alia, accommodating parts of a shimming system and/or of a cooling system of the generator 220. In particular two hollow-cylindrical areas 224 and 225 of the remaining area are used for connecting the gradient coils to the associated shield coils.

For accommodating a passive shimming device the generator 220 includes free spaces 271 that are distributed in the circumferential direction and continuous in the axial direction. One of the free spaces 271 is shown in the longitudinal section view with the shimming device introduced into it in longitudinal section. The shimming device includes a support element 275 fitted with shimming elements 277 made of a magnetic material. In another embodiment the shimming device can of course also include an active shim. As the shimming device is located outside the field flowback space 232, there is advantageously no mutual interference between the radio frequency antenna and the shimming elements 277. In contrast to FIG. 1, the field flowback space 232 shown in FIG. 2 is filled not with a bracing element but with air. The description for FIG. 1 otherwise applies analogously to FIG. 2.

Figure 3:
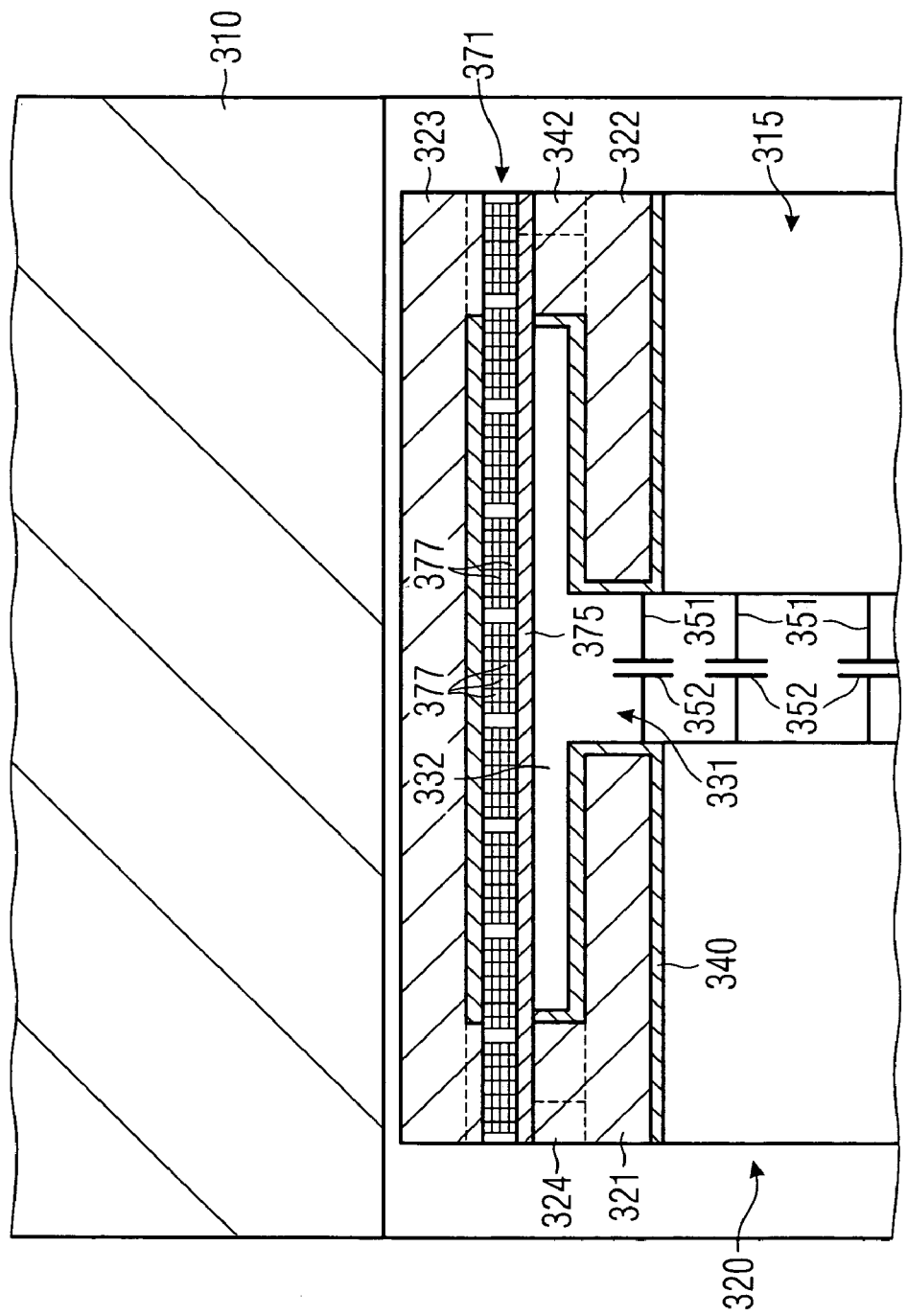
FIG. 3 shows a longitudinal section through a top half of a magnetic resonance device having a tunnel-like space for accommodating a patient and having a generator of time-variable magnetic fields, which generator contains a field flowback space and a shimming device traversing said field flowback space.

As a further exemplary embodiment of the invention, FIG. 3 shows a longitudinal section through a top half of a magnetic resonance device having a tunnel-like space 315 for accommodating a patient. The magnetic resonance device includes a superconducting basic field magnet 310 approximately hollow-cylindrical in shape for generating an as homogeneous as possible static basic magnetic field in the space 315 for accommodating a patient. A generator 320 of time-variable magnetic fields comprising an actively shielded gradient coil system and a radio frequency antenna is located in the cylinder-like cavity of the basic field magnet 310.

The generator 320 includes two hollow-cylindrical areas 321 and 322 in which are located electrical conductors of gradient coils of the gradient coil system. Extending between the areas 321 and 322 is a hollow-cylindrical free space 331 functioning as an opening for a hollow-cylindrical field flowback space 332 located behind it and forming an undercut in terms of said hollow-cylindrical free space 331. The generator 320 furthermore includes a radio frequency shield 340. The hollow-cylindrical free space 331 is bridged with conductor rods 351 for forming the radio frequency antenna of the magnetic resonance device. Said conductor rods 351 are conductively connected on a radio frequency basis to the radio frequency shield 340. The conductor rods 351 are interrupted approximately in the middle for intermediately connected resonance capacitors 352.

The generator 320 furthermore contains a hollow-cylindrical area 323 in which are located conductors of the shield coils belonging to the gradient coils. The remaining area of the generator 320 is available for, inter alia, accommodating parts of a shimming system and/or of a cooling system of the generator 320. In particular two hollow-cylindrical areas 324 and 325 of the remaining area are used for connecting the gradient coils to the associated shield coils.

For accommodating a passive shimming device the generator 320 includes free spaces 371 that are distributed in the circumferential direction and continuous in the axial direction. One of the free spaces 371 is shown in the longitudinal section view with the shimming device introduced into it in longitudinal section. The shimming device includes a support element 375 fitted with shimming elements 377 made of a magnetic material. In another embodiment the shimming device can of course also include an active shim. As the shimming device penetrates the radio frequency shield 340 and is located partially within of the field flowback space 332, properties of the radio frequency antenna are indeed influenced, especially in terms of tuning and degree of efficiency, but this influence is the less the closer the shimming elements 377 are located around the radio frequency shield 340. To compensate for this, the field flowback space 332 shown in FIG. 3 is advantageously larger in volume than the field flowback space 232 shown in FIG. 2, with the external dimensions of the generators 220 and 320 otherwise remaining the same. This is because the shimming devices are located only at positions distributed over the circumference and the spaces available between the shimming devices can thus be used for the field flowback. In contrast to FIG. 1, the field flowback space 332 shown in FIG. 3 is in this case too filled not with a bracing element but with air. The description for FIG. 1 otherwise applies analogously to FIG. 3.

Figure 4:
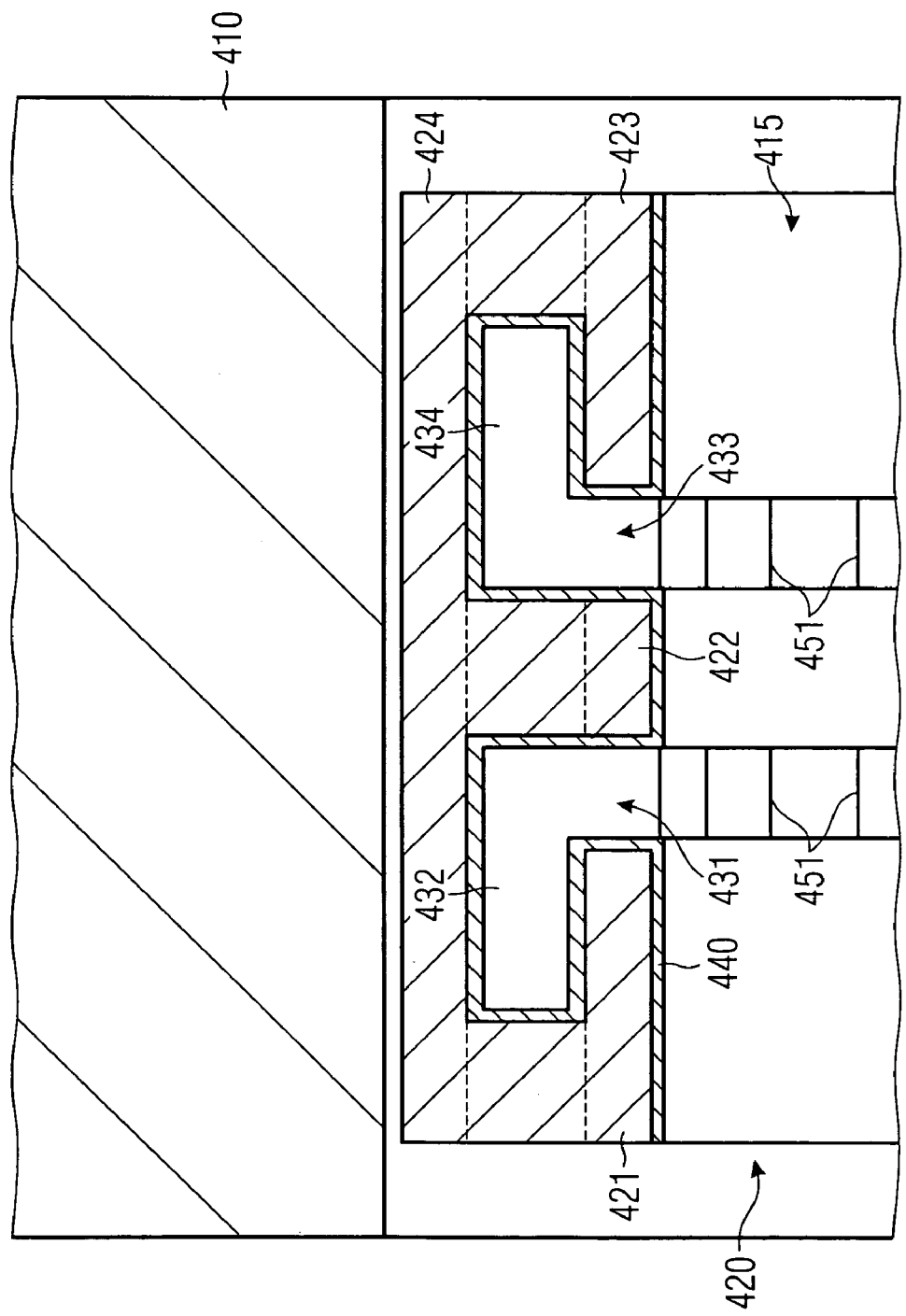
FIG. 4 shows a longitudinal section through a top half of a magnetic resonance device having a tunnel-like space for accommodating a patient and having a generator of time-variable magnetic fields, which generator contains two field flowback spaces.

As a further exemplary embodiment of the invention, FIG. 4 finally shows a longitudinal section through a top half of a magnetic resonance device having a tunnel-like space 415 for accommodating a patient. The magnetic resonance device includes a superconducting basic field magnet 410 substantially hollow-cylindrical in shape for generating an as homogeneous as possible static basic magnetic field in the space 415 for accommodating a patient. A generator 420 of time-variable magnetic fields comprising an actively shielded gradient coil system and a radio frequency antenna is located in the cylinder-like cavity of the basic field magnet 410.

The generator 420 includes three hollow-cylindrical areas 421, 422, and 423 in which are located electrical conductors of the gradient coil system. Extending between the areas 421, 422, and 423 are two hollow-cylindrical free spaces 431 and 433 functioning as openings for hollow-cylindrical field flowback spaces 432 and 434 located behind them and forming an undercut in terms of the respective hollow-cylindrical free space 431 and 433. An area of the generator 420 facing the space 415 for accommodating a patient, including the areas bordering the free spaces 431 and 433 and the field flowback spaces 432 and 434, is furthermore provided with a radio frequency shield 440. The hollow-cylindrical free spaces 431 and 433 are bridged with conductor rods 451 for forming the radio frequency antenna. The conductor rods 451 are conductively connected on a radio frequency basis to the radio frequency shield 440. A part of the radio frequency shield 440 also forms a part of the current paths of the radio frequency antenna. Field lines of a radio frequency field that can be generated by means of the radio frequency antenna or, as the case may be, registered by means of the radio frequency antenna can herein close across the hollow-cylindrical 431 and 433 within the field flowback spaces 432 and 434. Double use, as it were, is here made of the field flowback spaces 432 and 434 in that they allow both the field lines of the radio frequency field and the field lines of the gradient fields generated by the gradient coils to close within them.

The generator 420 furthermore contains a hollow-cylindrical area 424 in which are located conductors of the shield coils belonging to the gradient coils. The remaining area of the generator 420 is available for, inter alia, accommodating parts of a shimming system and/or of a cooling system of the generator 420.

In other types of embodiments it is in particular possible for embodiments having shimming devices located inside or outside a field flowback space and embodiments having a field flowback space filled with a substance other than air to be combined with the respective other embodiments described in the preceding.

Attention is furthermore drawn to the applicant's subsequently published DE 103 13 229 for, inter alia, a more detailed description of advantages of a gradient coil system containing two spaced apart areas for conductors of gradient coils between which is located a radio frequency antenna, in contrast to conventional solutions and in terms of the distribution of conductors of gradient coils over said areas.

The invention claimed is:

1. A generator for generating time-variable magnetic fields of a magnetic resonance device having an examination space for accommodating at least a portion of a subject to be examined, comprising:
    a gradient coil arrangement having a plurality of first conductors extending within a first area at least partially surrounding the examination space, the first area having a first sub-area free of the first conductors;
    a plurality of second conductors arranged within the first sub-area operatively connected to a high-frequency antenna of the generator; and
    a second area within which a magnetic field backflow occurs, the second area extending from the first sub-area to a high-frequency shield in a direction away from the examination space, wherein said second area is disposed to close flow of field lines from (1) a gradient field generated by the gradient coil arrangement and (2) a radio frequency field generated by the high frequency antenna.

2. The generator according to claim 1, wherein the second area has an undercut relative to the first sub-area.

3. The generator according to claims 1, further comprising a plurality of third conductors of a shielding coil arrangement assigned to the gradient coil arrangement, the third conductors extending in a direction away from the examination space and arranged beyond the second area.

4. The generator according to claims 1, further comprising a second sub-area having a third area within which a magnetic field backflow occurs.

5. The generator according to claim 4, wherein the first and second sub-areas are separated by at least one conductor of the first conductors.

6. The generator according to claim 4, wherein the second and third areas are structurally separate units.

7. The generator according to claim 4, wherein an element chosen from the group consisting of the first area, the second area, the third area, the first sub-area and the second sub-area is formed as a hollow cylinder.

8. The generator according to claim 4, wherein the third area includes air.

9. The generator according to claim 4, further comprising a second stiffening element arranged in the third area.

10. The generator according to claim 9, wherein the second stiffening element includes a plurality of fiber-reinforced plates and a foam material.

11. The generator according to claim 1, wherein an element chosen from the group consisting of the first area, the first sub-area and the second area is formed as a hollow cylinder.

12. The generator according to claim 11, wherein the second conductors include poles extending longitudinally along the first sub a and bridging the first sub-area.

13. The generator according to claim 12, wherein at least one of the poles includes a first and a second sub-pole connected by a capacitor.

14. The generator according to claim 1, wherein the generator includes an accommodation space for accommodating a shimming device.

15. The generator according to claim 14, wherein the second area includes the accommodation space at least partially.

16. The generator according to claim 14, wherein the shimming device includes a carrier element and a plurality of shimming elements arranged on the carrier element.

17. The generator according to claim 16, wherein the shimming elements include a magnetic material.

18. The generator according to claim 1, wherein the second area includes air.

19. The generator according to claim 10, further comprising a fist stiffening element arranged in the second area.

20. The generator according to claim 19, wherein the first stiffening element includes a plurality of fiber-reinforced plates and a foam material.

21. The generator according to claim 20, wherein a volume of the foam material is larger than a volume of the plurality of fiber-reinforced plates.

22. A magnetic resonance device, comprising:
    an examination space for accommodating at least a portion of a subject to be examined; and
    a generator for generating time-variable magnetic fields, the generator comprising:
    a gradient coil arrangement having a plurality of first conductors extending within a first area at least partially surrounding the examination space, the first area having a first sub-area free of the first conductors;
    a plurality of second conductors arranged within the first sub-area operatively connected to a high-frequency antenna of the generator; and
    a second area within which a magnetic field backflow occurs, the second area extending from the first sub-area to a high-frequency shield in a direction away from the examination space, wherein said second area is disposed to close flow of field lines from (1) gradient field generated by the gradient coil arrangement and (2) a radio frequency field generated by the high frequency antenna.

* * * * *